United States Patent

Nemoto

[11] Patent Number: 5,939,361
[45] Date of Patent: Aug. 17, 1999

[54] METHOD OF FABRICATING TL OR HG-CONTAINING OXIDE SUPERCONDUCTOR FILM

[75] Inventor: Masaaki Nemoto, Tsukuba, Japan

[73] Assignee: Sanyo Electric Co., Ltd., Osaka, Japan

[21] Appl. No.: 09/042,742

[22] Filed: Mar. 17, 1998

[30] Foreign Application Priority Data

Mar. 19, 1997 [JP] Japan .................................. 9-066439

[51] Int. Cl.$^6$ ............................ H01L 39/24; C23C 14/34
[52] U.S. Cl. .................. 505/475; 505/473; 505/731; 505/120; 204/192.24; 427/62
[58] Field of Search .................................... 505/475, 473, 505/731, 120; 204/192.24; 427/62, 126.3

[56] References Cited

U.S. PATENT DOCUMENTS 5,112,800   5/1992   Hermann et al. ........................ 505/1

OTHER PUBLICATIONS

Holstein et al, Appl. Phys. lett. 61(8) Aug. 1992, pp. 982–984.
Japanese Journal of Applied Physics, vol. 25, No. 10, pp. L868–L870, Oct. 1986.

*Primary Examiner*—Roy V. King
*Attorney, Agent, or Firm*—Armstrong, Westerman, Hattori, McLeland & Naughton

[57] ABSTRACT

A substrate is set in a reaction chamber, to heat the substrate to a predetermined temperature. Tl, Ba, Ca, Cu and O are supplied to the substrate by a Tl evaporation source and a target, to cause a TlBaCaCuO film to grow on the substrate. The TlBaCaCuO film is crystallized for each formation of each of its blocks each having a layered structure. In an incomplete block which is being formed, the amount of evaporation of Tl by the heating is large, so that the amount of evaporation of Tl varies depending on the ratio of an uncrystallized region on its surface. In a complete block after the formation, the amount of evaporation of Tl by the heating is small, and is approximately constant. Film growth is stopped for a predetermined time period for each formation of the block, to control the amount of supply of Tl depending on the forming step of the block.

19 Claims, 6 Drawing Sheets

(STOP OF FILM GROWTH)

(FILM GROWTH)

METHOD OF FABRICATING TL OR HG-CONTAINING OXIDE SUPERCONDUCTOR FILM

BACKGROUND OF THE INVENTION

1. Field of the Invention

The present invention relates generally to a method of fabricating a compound film, and more particularly, to a method of fabricating a compound film composed of a plurality of elements in which the vapor pressure of the particular element is higher than the vapor pressures of the other elements.

2. Description of the Background Art

It has been expected that a Tl system oxide superconductor such as a TlBaCaCuO superconductor (a thallium-barium-calcium-copper-oxygen system superconductor; a TBCCO system superconductor) is applied in a microwave device and a milliwave device because it is low in resistance on the surface (surface resistance) of its crystal through which a current flows, has a small loss in a high-frequency band such as a microwave band or a millimeter wave band, and has a critical temperature exceeding 100K so that it can be used at high temperatures.

In fabricating a superconductive film of high quality, an in-situ process for crystallizing a substrate during film formation while heating the substrate in a reaction chamber (film formation in the same reaction chamber) is presupposed. In the TlBaCaCuO superconductor, however, the vapor pressure of Tl is high. Therefore, Tl evaporates and escapes before TlBaCaCuO reaches a crystallization temperature by heating the substrate during film formation. Consequently, the composition ratio of Tl in a film which is being formed is decreased at the crystallization temperature. Therefore, a superconductive film having sufficient superconductive characteristics is not obtained.

When a TlBaCaCuO superconductive film is fabricated, therefore, a precursor film (a precursor) having an amorphous structure including Tl, Ba, Ca, Cu, and O is formed at room temperature, and the precursor film is heat-treated at a crystallization temperature of approximately 800 to 900° C. Also in the case of the heat treatment, Tl evaporates, so that the composition ratio of Tl is decreased. In order to compensate for Tl which evaporates, therefore, a pellet for compensation (a material supply member) composed of Tl, Ba, Ca, Cu and O, together with the precursor film, is arranged in a sealed container, for example, to heat-treat the precursor film. Consequently, the sealed container is filled with vapors of Tl, so that Tl in the precursor film is compensated for.

In the conventional method of fabricating a TlBaCaCuO superconductive film, however, the precursor film must be heat-treated at a high temperature of approximately 800 to 900° C. in order to crystallize the precursor film, so that the surface of the TlBaCaCuO superconductive film is roughened.

SUMMARY OF THE INVENTION

An object of the present invention is to provide a method of fabricating a compound film, in which a compound film having a predetermined composition ratio and good crystallizability can be stably fabricated.

Another object of the present invention is to provide a method of stably fabricating a thallium system oxide superconductive film having a predetermined composition ratio and good crystallizability.

A method of fabricating a compound film composed of a plurality of elements, at least one particular element out of the plurality of elements having a higher vapor pressure than the vapor pressure(s) of the other element(s) in the present invention comprises the steps of setting a substrate in a reaction chamber, heating the substrate in the reaction chamber to a predetermined temperature, and supplying the plurality of elements to the substrate heated to the predetermined temperature to cause the compound film to grow on the substrate while controlling the amount of supply of the particular element to the compound film depending on the change in the amount of evaporation of the particular element from the compound film, to compensate for the amount of the particular element in the compound film.

In the method of fabricating a compound film according to the present invention, the plurality of elements are supplied to the substrate set in the reaction chamber in a state where the substrate is heated to a predetermined temperature, and the amount of the particular element in the compound film is compensated for depending on the change in the amount of evaporation of the particular element from the compound film growing on the substrate, so that the crystallized compound film having a predetermined composition ratio is formed in the reaction chamber. Consequently, the surface of its crystal is not roughened. Moreover, a compound film having a predetermined composition ratio and good crystallizability is stably obtained.

The compound film is crystallized for each of its blocks each composed of a predetermined number of layers. The step of controlling the amount of supply of the particular element to the compound film comprises the steps of stopping the supply of the other element(s) for each formation of the block of the compound film, to stop the growth of the compound film for a predetermined time period, supplying the particular element to the compound film depending on the amount of evaporation of the particular element from the compound film while the growth of the compound film is stopped, and supplying the other element(s) to the compound film on the substrate a predetermined amount at a time while the block of the compound film is growing, and controlling the amount of supply of the particular element to the compound film depending on the change in the amount of evaporation of the particular element from the compound film.

In this case, the growth of the compound film is stopped for a predetermined time period every time each of the crystallized blocks of the compound film growing on the substrate is formed, so that the composition of the block is corrected and the crystallizability thereof is improved while the growth of the compound film is stopped. Consequently, a compound film having a uniform composition ratio and good crystalllzability is more stably provided.

The compound film may be composed of a thallium system oxide superconductive material, and the particular element may be thallium. In the thallium system oxide superconductive material, the vapor pressure of thallium is high, so that thallium evaporates from the compound film growing on the substrate by heating the substrate. In the fabricating method according to the present invention, thallium in the compound film is compensated for by controlling the amount of supply of thallium depending on the change in the amount of evaporation of thallium from the compound film, so that the composition ratio of thallium in the compound film growing on the substrate is kept constant. Consequently, a thallium system oxide superconductive film having a predetermined composition ratio and good crystallizability is stably formed on the substrate in the reaction chamber.

The thallium system oxide superconductive material may include thallium, barium, calcium, copper, and oxygen. In this case, a TlBaCaCuO superconductive film having a predetermined composition ratio and good crystallizability is formed on the substrate in the reaction chamber. Further, the thallium system oxide superconductive material may include thallium, barium, copper and oxygen. In this case, a TlBaCuO superconductive film having a predetermined composition ratio and good crystallizability is stably formed on the substrate in the reaction chamber.

The compound film may be composed of a mercury system oxide superconductive material, and the particular element may be mercury. Also in this case, mercury in the compound film is compensated for by controlling the amount of supply of mercury depending on the change in the amount of evaporation of mercury from the compound film, so that the composition ratio of mercury in the compound film growing on the substrate is kept constant. Consequently, a mercury system oxide superconductive film having a predetermined composition ratio and good crystallizability is stably formed on the substrate in the reaction chamber.

Each of the blocks, which are growing, of the compound film may be in an amorphous state and/or a mixed state of the plurality of elements. In this case, the compound film in the amorphous state and/or the mixed state of the plurality of elements enters a crystallized state for each formation of the block of the compound film.

Each of the blocks of the compound film may have a layered structure including TlO, BaO, $CuO_2$, Ca, $CuO_2$, BaO and TlO in this order.

It is preferable that the heating temperature of the substrate is not less than 600° C. nor more than 800° C. Consequently, the compound film which is growing can be sufficiently crystallized without roughening the surface of its crystal.

The substrate may be a MgO substrate, an $LaAlO_3$ substrate, a YSZ substrate, an $SrTiO_3$ substrate, or a sapphire substrate. A buffer layer may be formed on the substrate.

The method of fabricating a compound film may further comprises the steps of setting a first supply source including at least the element(s) excluding the particular element out of the plurality of elements in the reaction chamber, setting a second supply source including the particular element in the reaction chamber, providing a first shutter between the first supply source and the substrate so as to be capable of being freely opened or closed, and providing a second shutter between the second supply source and the substrate so as to be capable of being freely opened or closed. The step of stopping the growth of the compound film may comprise the step of closing the first shutter for the predetermined time period, the step of controlling the amount of supply of the particular element to the compound film while each of the blocks of the compound film is growing may comprise the step of controlling the amount of supply of the particular element to the substrate from the second supply source in a state where the first and second shutters are opened, and the step of supplying the particular element to the compound film while the growth of the block of the compound film is stopped may comprise the step of closing the first shutter and opening the second shutter. The first supply source may further include the particular element.

The step of setting the first supply source in the reaction chamber may comprise the step of fabricating a target including at least the element(s) excluding the particular element out of the plurality of elements, and setting the target in the reaction chamber, the step of setting the second supply source in the reaction chamber may comprise the step of setting an evaporation source including the particular element in the reaction chamber, and the step of supplying the plurality of elements to the substrate may comprise the step of sputtering the target and heating the evaporation source.

The target may include barium, calcium, copper, and oxygen, and the evaporation source may include thallium.

The step of fabricating the target may comprise the step of sintering and pressing powder of an oxide containing barium, powder of an oxide containing calcium, and powder of an oxide containing copper. The step of fabricating the target may comprise the step of sintering and pressing powder of an oxide containing barium, powder of an oxide containing calcium, and powder of an oxide containing copper. The evaporation source may include an oxide containing thallium.

The method of fabricating a compound film may further comprise the step of previously measuring the change in the amount of evaporation of the particular element from the compound film.

The amount of evaporation of the particular element from the compound film depends on the ratio of uncrystallized region on the surface of the film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
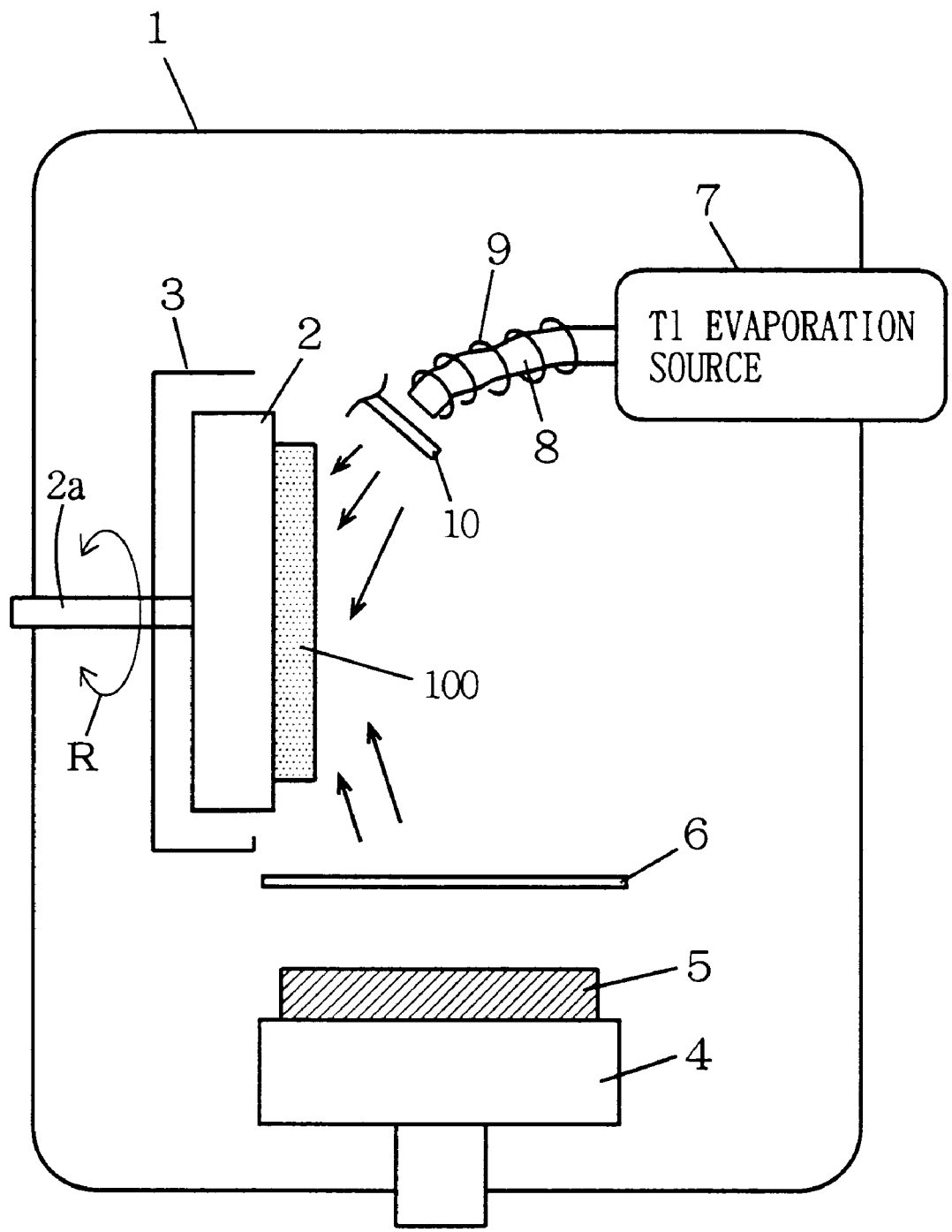
FIG. 1 is a schematic view of a fabricating apparatus used for fabricating a TlBaCaCuO superconductive film in one embodiment of the present invention.

Description is now made of a method of fabricating a Tl system oxide superconductive film according to one embodiment of the present invention. FIG. 1 is a schematic view of a fabricating apparatus used for fabricating the Tl system oxide superconductive film in the present embodiment. The fabricating apparatus is a sputtering apparatus.

In FIG. 1, a substrate holder 2 is arranged in a reaction chamber (a vacuum chamber) 1. A substrate 100 is held on the substrate holder 2. The substrate holder 2 is constructed so as to be rotatable in a direction indicated by an arrow R by a rotating shaft $2a$. A substrate heating heater is contained in the substrate holder 2. The substrate 100 on the substrate holder 2 is heated to a predetermined temperature by the substrate heating heater. Further, a heat sealing plate 3 is provided on the sides and the reverse surface of the substrate holder 2.

A target holder 4 is provided in the reaction chamber 1. A target 5 is set on the target holder 4. A shutter 6 is provided so as to be capable of being freely opened or closed above the target holder 4.

Furthermore, a Tl evaporation source 7 is provided in the reaction chamber 1. The Tl evaporation source 7 heats a compound containing Tl, to emit vapors of Tl. The vapors of Tl emitted by the Tl evaporation source 7 are supplied to the substrate 100 by a Tl inlet tube 8. A heater for a Tl inlet tube 9 is mounted around the Tl inlet tube 8. A shutter 10 is provided so as to be capable of being opened or closed ahead of an end of an opening of the Tl inlet tube 8.

The target 5 is fabricated by a solid phase reaction process. Powder of $BaCO_3$, powder of $CaCO_3$, and powder of CuO are mixed, and are calcined at a temperature of 900° C. for ten hours, after which powder of $Tl_2O_3$ is mixed therewith. A mixture obtained is pressed, and is sintered at a temperature of 930° C. for one hour. The composition of Tl, Ba, Ca, Cu, and O in the target 5 is 0:2:1:2:x, 0:2:2:3:x, 2:2:1:2:x, or 2:2:2:3:x. The rate of film formation by the target 5 is 0.2 to 3 Å per second.

$Tl_2O$ is used for the Tl evaporation source 7, and is heated at a temperature of 600 to 700° C. The rate of film formation for Tl by the Tl evaporation source 7 is 1 to 30 A° per second. When the supply of Tl for film formation is performed by the Tl evaporation source 7, the powder of $Tl_2O_3$ does not have to be mixed at the time of fabrication of the target.

As the substrate 100, an MgO substrate, an $LaAlO_3$ substrate, a YSZ substrate, or a $SrTiO_3$ substrate is used. An MgO substrate having a $CeO_2$ buffer layer formed thereon may be used. Alternatively, a sapphire substrate may be used. The substrate temperature is taken as 600 to 800° C.

Ar and $O_2$ are used as sputter gas. The gas pressure of Ar is taken as 10 mTorr, and the gas pressure of $O_2$ is taken as 10 mTorr. High-frequency effective power of the manufacturing apparatus is taken as 90 W. A TlBaCaCuO superconductive film having a thickness of 0.3 to 2 μm is fabricated on the substrate 100 under the foregoing conditions.

Figure 2:
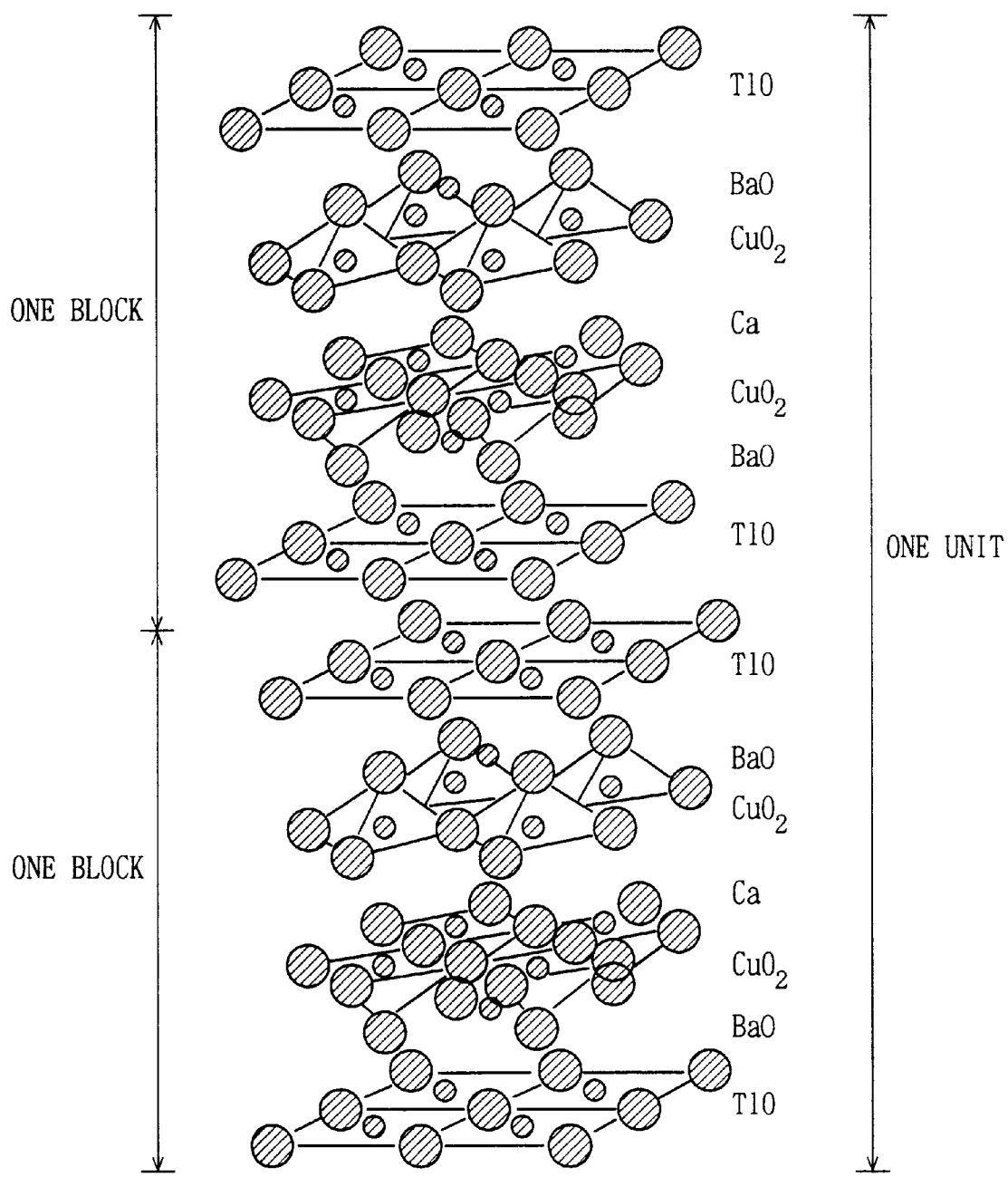
FIG. 2 is a schematic view showing the structure of a $Tl_2Ba_2CaCu_2O_x$ superconductor.

Description is now made of the construction of the TlBaCaCuO superconductor. FIG. 2 is a schematic view showing the structure of a $Tl_2Ba_2CaCu_2O_x$ superconductor. As shown in FIG. 2, one unit of the $Tl_2Ba_2CaCu_2O_x$ superconductor is composed of two blocks. One of the blocks has a layered structure obtained by laminating layers of TlO, BaO, $CuO_2$, Ca, $CuO_2$, BaO, and TlO. The $Tl_2Ba_2CaCu_2O_x$ superconductor is crystallized in units of blocks. Specifically, a block which is growing (an incomplete block) is in an amorphous state, or a mixed state of Tl, Ba, Ca, Cu and O, so that a $Tl_2Ba_2CaCu_2O_x$ crystal is formed by formation of one block.

In a crystallized block after formation (a substantially complete block), the amount of evaporation of Tl by heating is small, and is approximately constant. On the other hand, in the incomplete block in the amorphous state or the mixed state during formation, the amount of evaporation of Tl by heating is large, and the amount of evaporation of Tl changes depending on the ratio of an uncrystallized region on its surface. In the present embodiment, film growth is stopped for a predetermined time period for each formation of a block, and the amount of supply of Tl is controlled depending on the forming step of the block. Tl is evaporated in the form of $Tl_2O$ (or $TlO_x$) and the like.

Figure 3A:
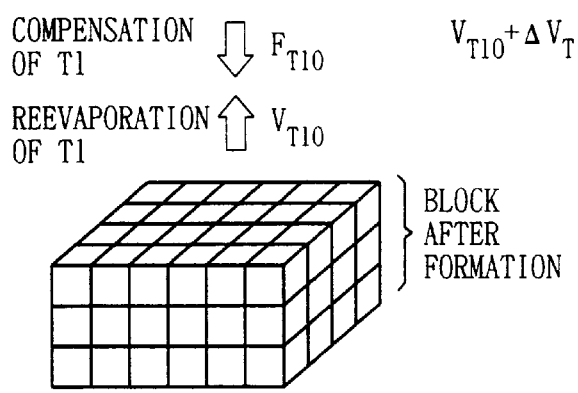
FIG. 3 is a schematic perspective view showing the relationship between the amount of reevaporation of Tl and the amount of compensation of Tl in a fabricating method according to one embodiment of the present invention.
Figure 3B:
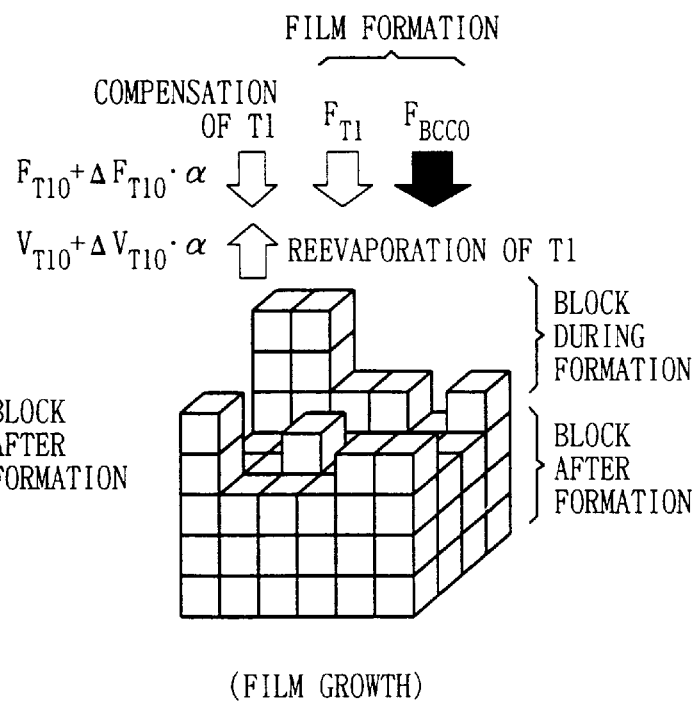
Figure 4:
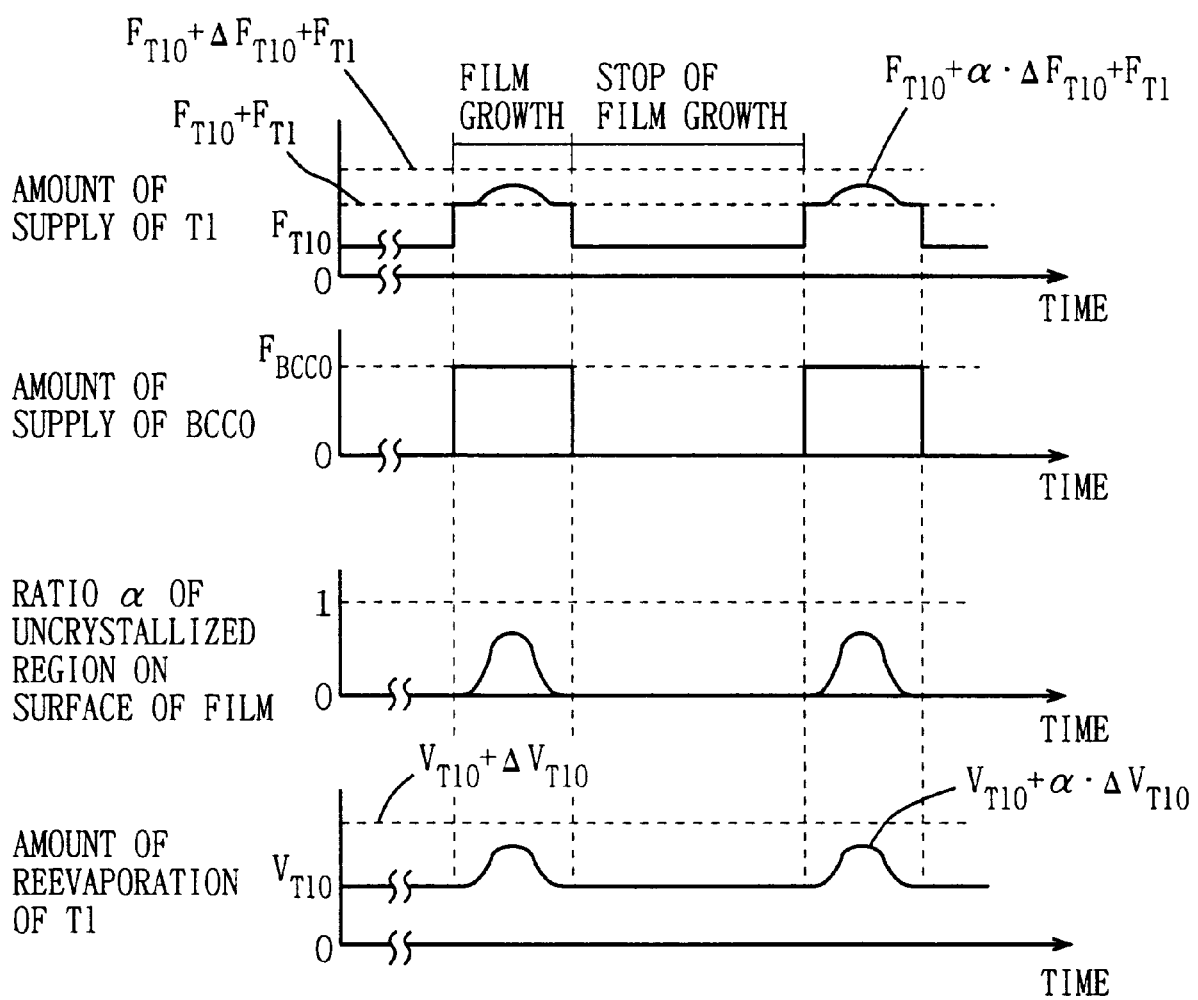
FIG. 4 is a diagram showing the respective amounts of supply of elements, the ratio of an uncrystallized region on the surface of a film, and the change with time of the amount of reevaporation of Tl in the fabricating method according to one embodiment of the present invention.

FIG. 3 is a schematic perspective view showing the relationship between the amount of reevaporation of Tl and the amount of compensation of Tl in the fabricating method according to the present embodiment. FIG. 4 is a diagram showing the respective amounts of supply of elements, the ratio of an uncrystallized region on the surface of a film, and the change with time of the amount of reevaporation of Tl in the fabricating method according to the present embodiment.

In FIGS. 3 and 4, $F_{Tl}$ is the amount of supply of Tl for film formation, and $F_{BCCO}$ is the amount of supply of BCCO (Ba, Ca, Cu and O) for film formation. $V_{TlO}$ is the amount of reevaporation of Tl from the complete block after formation, and $F_{TlO}$ is the amount of compensation of Tl corresponding to the amount of reevaporation $V_{TlO}$. $\alpha$ is the ratio of the uncrystallized region on the surface of the film, where $0 \leq \alpha < 1$. $\Delta V_{TlO}$ is an amount of increase in the amount of reevaporation from the amount of reevaporation of Tl from the complete block in a case where the entire surface is the uncrystallized region, and $\Delta F_{TlO}$ is the amount of compensation of Tl corresponding to the amount of reevaporation $\Delta V_{TlO} \cdot V_{TlO} + \Delta V_{TlO} \cdot \alpha$ is the amount of reevaporation of Tl from the incomplete block during formation, and $F_{TlO} + \Delta F_{TlO} \cdot \alpha$ is the amount of compensation of Tl corresponding to $V_{TlO} + \Delta V_{TlO} \cdot \alpha$.

In the fabricating method according to the present embodiment, the amount of supply of BCCO is set to zero by closing the shutter 6 shown in FIG. 1 for each formation of one block, to stop film growth for a predetermined time period, as shown in FIG. 4. As shown in FIG. 3(a), the entire surface of the film is in a crystallized state when the film growth is stopped, so that the amount of reevaporation of Tl from the surface of the film is constant at $V_{TlO}$. Therefore, the amount of compensation of Tl from the Tl evaporation source 7 is $F_{TlO}$ ($F_{TlO} = V_{TlO}$), as shown in FIG. 4. A time period during which the film growth is stopped is set to several seconds to several tens of seconds, for example.

After an elapse of a predetermined time period, the shutter 6 is closed. Consequently, the amount of supply of BCCO becomes $F_{BCCO}$. At this time, the amount of supply of Tl for film formation is $F_{Tl}$. Consequently, the formation of the block proceeds, as shown in FIG. 3(b). The incomplete block which is being formed is brought into an amorphous state or a mixed state. After the ratio $\alpha$ of the uncrystallized region on the surface of the film is gradually increased, and is then gradually decreased. In this case, the amount of reevaporation of Tl from the surface of the film is $V_{TlO} + \Delta V_{TlO} \cdot \alpha$. As shown in FIG. 4, therefore, the amount of supply of Tl is the sum of $F_{Tl}$ which is the amount of supply of Tl for film formation and $F_{TlO} + \Delta F_{TlO} \cdot \alpha$ which is the amount of compensation of Tl ($F_{TlO} + \Delta F_{TlO} \cdot \alpha = V_{TlO} + \Delta V_{TlO} \cdot \alpha$). Consequently, the composition ratio of Tl in the incomplete block which is being formed is kept constant.

The film growth is thus stopped for a predetermined time period for each formation of one block, thereby correcting the composition and improving the crystallizability in the complete block after the formation when the film growth is stopped.

The amount of reevaporation of Tl in a case where the film growth is stopped and the change with time of the amount of reevaporation of Tl in a case where the film is growing may be previously measured using a sample to control the amount of compensation of Tl on the basis of their measured values. When the film is formed using an MBE (molecular beam epitaxy) process, the amount of compensation of Tl may be controlled while observing its crystallized state by RHEED (reflection high energy electron diffraction) during film formation.

Figure 5:
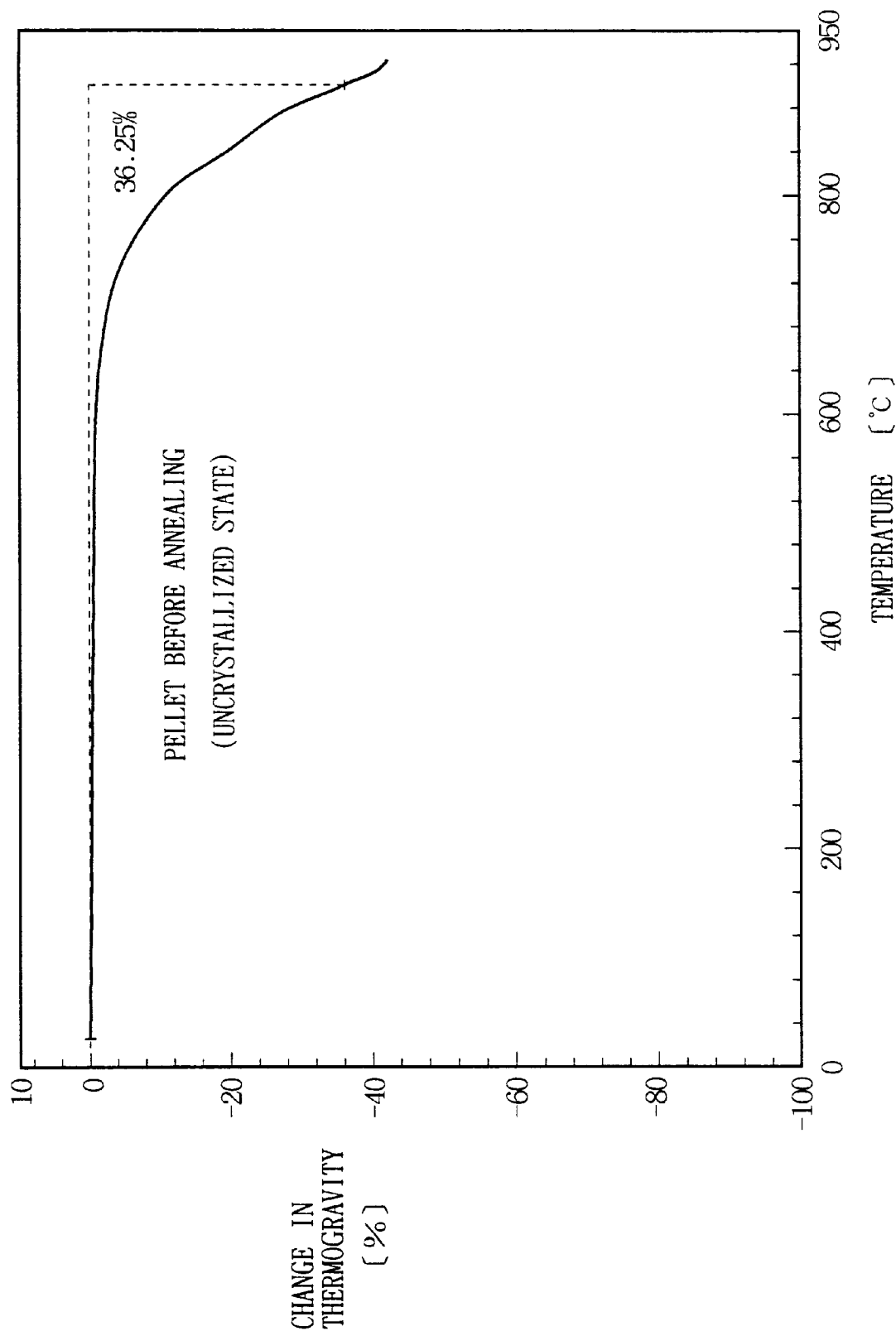
FIG. 5 is a diagram showing the results of measurement of the amount of reevaporation of Tl by heating TlBaCaCuO in an uncrystallized state.
Figure 6:
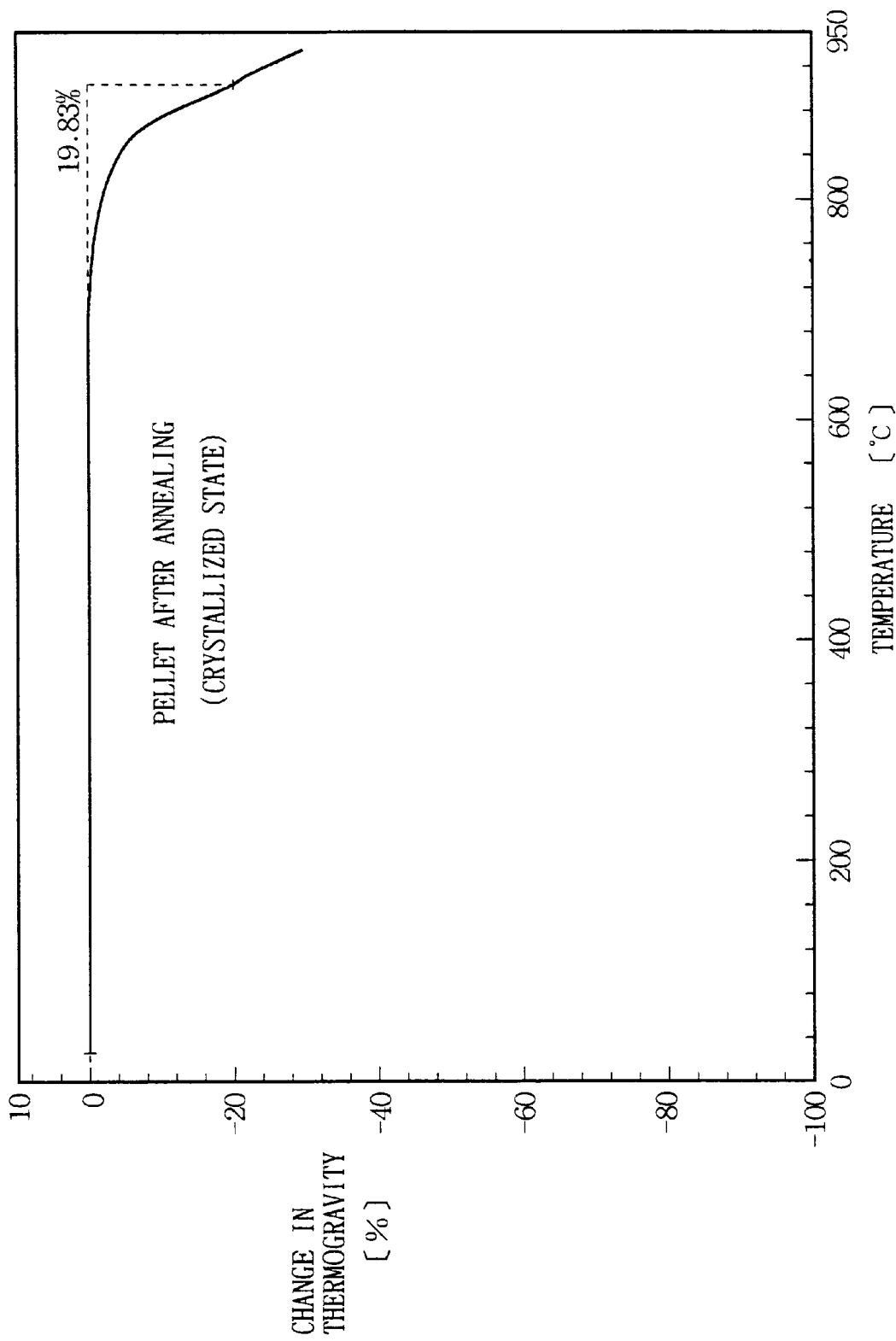
FIG. 6 is a diagram showing the results of measurement of the amount of reevaporation of Tl by heating TlB1CaCuO in a crystallized state.

The difference between the amounts of reevaporation of Tl in TlBaCaCuO in an uncrystallized state and a crystallized state is measured using a pellet including Tl, Ba, Ca, Cu, and O. FIG. 5 illustrates the results of measurement of the change in thermogravity of the pellet before annealing, and FIG. 6 illustrates the results of measurement of the change in thermogravity of the pellet after annealing. The pellet before annealing is in the uncrystallized state, and the pellet after annealing is in the crystallized state. The pellet before annealing and the pellet after annealing are heated to approximately 900° C. from room temperature at a rate of temperature rise of 10.0° C. per minute, to measure the change in the thermogravity of the pellet.

When the pellet is heated, the vapor pressure of Tl is high, so that Tl evaporates again. Consequently, the thermogravity of the pellet is decreased by the amount of reevaporation of Tl.

As shown in FIG. 5, in the pellet before annealing in the uncrystallized state, the thermogravity thereof is decreased by 36.25% by heating to a temperature of approximately 900° C. On the other hand, as shown in FIG. 6, in the pellet after annealing in the crystallized state, the thermogravity thereof is decreased by 19.83% by heating to a temperature of approximately 900° C. As apparent from the results, in TlBaCaCuO in the crystallized state, the amount of reevaporation of Tl by heating is smaller, as compared with that in TlBaCaCuO in the uncrystallized state.

According to the fabricating method in the present embodiment, the amount of compensation of Tl is controlled in correspondence with the change with time of the amount of reevaporation of Tl depending on the crystallized state on the surface of the film, so that the composition ratio of Tl in the film is kept constant. The film growth is stopped for each formation of one block, so that the composition in the film is corrected, and the crystallizability therein is improved. Further, TlBaCaCuO is crystallized in the reaction chamber 1, so that the surface flatness and the orientation are improved, and the electrical characteristics such as the reduction in surface resistance are improved. A TlBaCaCuO superconductive film having a predetermined composition ratio and good crystallizability is thus formed by an in-situ process.

In fabricating a device, a layer made of another material can be laminated on the TlBaCaCuO superconductive film in the reaction chamber 1, so that an interface therebetween is not degraded. Consequently, it is possible to fabricate a good SNS (Superconductor-Normal conductor-Superconductor) junction or a good SIS (Superconductor-Insulator-Superconductor) junction.

Although in the above-mentioned embodiment, a sputtering method is used for fabricating the TlBaCaCuO superconductive film, another crystal growth process such as MBE or laser ablation may be used.

Although in the above-mentioned embodiment, description was made of fabrication of the TlBaCaCuO superconductive film, the fabricating method according to the present invention is also applicable to a method of fabricating a TlBaCuO superconductive film, or is also applicable to fabrication of a mercury system oxide superconductive film including Hg in place of Tl.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a superconducting film containing Tl or Hg and composed of a plurality of elements, the Tl or Hg of said plurality of elements having a higher vapor pressure than the vapor pressure(s) of the other element(s), comprising the steps of:

setting a substrate in a reaction chamber;

heating the substrate in said reaction chamber to a predetermined temperature; and supplying said plurality of elements to the substrate heated to said predetermined temperature to cause said superconducting film to grow on said substrate while controlling the amount of supply of said Tl or Hg to said superconducting film, to compensate for the amount of evaporation of said Tl or Hg in said superconducting film.

2. The method according to claim 1, wherein said superconducting film is crystallized for each of its blocks each composed of a predetermined number of layers, and the step of controlling the amount of supply of said Tl or Hg to said superconducting film comprises the steps of stopping the supply of said other element(s) for each formation of the block of said superconducting film, to stop the growth of said superconducting film for a predetermined time period, supplying said Tl or Hg to said superconducting film depending on the amount of evaporation of said Tl or Hg from said superconducting film while the growth of said superconducting film is stopped, and supplying said other element(s) to said superconducting film on said substrate a predetermined amount at a time while the block of said superconducting film is growing, and controlling the amount of supply of said Tl or Hg to said superconducting film depending on the change in the amount of evaporation of said Tl or Hg from said superconducting film.

3. The method according to claim 1, wherein said superconducting film is composed of a thallium system oxide superconductive material.

4. The method according to claim 3, wherein said thallium system oxide superconductive material includes thallium, barium, calcium, copper, and oxygen.

5. The method according to claim 3, wherein said thallium system oxide superconductive material includes thallium, barium, copper, and oxygen.

6. The method according to claim 1, wherein said superconducting film is composed of a mercury system oxide superconductive material.

7. The method according to claim 2, wherein each of the blocks, which are growing, of said superconducting film is in an amorphous state and/or a mixed state of said plurality of elements.

8. The method according to claim 2, wherein each of the blocks of said superconducting film has a layered structure including TlO, BaO, $CuO_2$, Ca, $CuO_2$, BaO and TlO in this order.

9. The method according to claim 1, wherein the heating temperature of said substrate is not less than 600° C. nor more than 800° C.

10. The method according to claim 1, wherein said substrate is an MgO substrate, an LaAlO$_3$ substrate, a YSZ substrate, an SrTiO$_3$ substrate, or a sapphire substrate.

11. The method according to claim 1, wherein a buffer layer is formed on said substrate.

12. The method according to claim 2, further comprising setting a first supply source including at least the element(s) excluding said Tl or Hg out of said plurality of elements in said reaction chamber, setting a second supply source including said Tl or Hg in said reaction chamber, providing a first shutter between said first supply source and said substrate so as to be capable of being freely opened or closed, and providing a second shutter between said second supply source and said substrate so as to be capable of being freely opened or closed, the step of stopping the growth of said superconducting film comprising the step of closing said first shutter for said predetermined time period, the step of controlling the amount of supply of said Tl or Hg to said superconducting film while each of the blocks of said superconducting film is growing comprising the step of controlling the amount of supply of said Tl or Hg to said substrate from said second supply source in a state where said first and second shutters are opened, and the step of supplying said Tl or Hg to said superconducting film while the growth of the block of said superconducting film is stopped comprising the step of closing said first shutter and opening said second shutter.

13. The method according to claim 12, wherein said first supply source further includes said Tl or Hg.

14. The method according to claim 12, wherein the step of setting said first supply source in said reaction chamber comprises the step of fabricating a target including at least the element(s) excluding said Tl or Hg out of said plurality of elements, and setting said target in said reaction chamber, the step of setting said second supply source in said reaction chamber comprises the step of setting an evaporation source including said Tl or Hg in said reaction chamber, and the step of supplying said plurality of elements to the substrate comprises the step of sputtering said target and heating said evaporation source.

15. The method according to claim 14, wherein said target includes barium, calcium, copper, and oxygen, and said evaporation source includes thallium.

16. The method according to claim 15, wherein said target further includes thallium.

17. The method according to claim 14, wherein said evaporation source includes an oxide containing thallium.

18. The method according to claim 1, further comprising the step of previously measuring the change in the amount of evaporation of said Tl or Hg from said superconducting film.

19. The method according to claim 1, wherein the amount of evaporation of said Tl or Hg from said superconducting film depends on the ratio of the uncrystallized region on the surface of the film.

* * * * *